(12) United States Patent
Bright et al.

(10) Patent No.: US 6,800,498 B2
(45) Date of Patent: Oct. 5, 2004

(54) METHOD OF PRODUCING AN ORGANIC LIGHT-EMISSIVE DEVICE

(75) Inventors: Christopher John Bright, Cambridge (GB); Timothy Butler, Stapleford (GB)

(73) Assignee: Cambridge Display Technology Limited (GB)

( * ) Notice: Subject to any disclaimer, the term of this patent is extended or adjusted under 35 U.S.C. 154(b) by 0 days.

(21) Appl. No.: 10/332,061

(22) PCT Filed: Jul. 5, 2001

(86) PCT No.: PCT/GB01/03014

§ 371 (c)(1),
(2), (4) Date: Feb. 19, 2003

(87) PCT Pub. No.: WO02/05362

PCT Pub. Date: Jan. 17, 2002

(65) Prior Publication Data

US 2003/0157737 A1 Aug. 21, 2003

(30) Foreign Application Priority Data

Jul. 6, 2000 (GB) .............................. 0016660

(51) Int. Cl.⁷ ..................... H01L 20/00; H01L 51/40
(52) U.S. Cl. ................. 438/21; 438/99; 438/22
(58) Field of Search ................. 438/21, 22, 99, 438/479

(56) References Cited

U.S. PATENT DOCUMENTS 5,019,748 A * 5/1991 Appelberg ............... 315/169.3
5,294,870 A * 3/1994 Tang et al. ................. 313/504
5,479,070 A 12/1995 Murakami
6,503,831 B2 1/2003 Speakman
6,576,093 B1 6/2003 Burroughes
6,617,093 B2 * 9/2003 Pokorny et al. ............ 430/200
2002/0105080 A1 8/2002 Speakman
2003/0076649 A1 4/2003 Speakman

FOREIGN PATENT DOCUMENTS

| EP | 0758836 | 7/2002 |
|----|---------|--------|
| WO | WO1988/004467 | 6/1988 |
| WO | WO1999/019900 | 4/1999 |
| WO | WO2001/008241 | 2/2001 |

* cited by examiner

*Primary Examiner*—Savitri Mulpuri
(74) *Attorney, Agent, or Firm*—Wong, Cabello, Lutsch, Rutherford & Brucculeri, L.L.P.

(57) ABSTRACT

A method of producing an organic light-emitting device comprising a patterned electroluminescent polymer layer arranged between two electrodes such that charge carriers can move between the first and second electrodes an the electroluminescent polymer layer, the method comprising the steps of (a) providing a substrate comprising the first electrode, (b) depositing solid particles comprising the electroluminescent polymer onto selected portions of the surface of the substrate, and (c) securing to the substrate those solid particles comprising electroluminescent polymer particles deposited onto the substrate in step (b) to form the patterned electroluminescent polymer; and (d) forming the second electrode over the surface of the electroluminescent.

16 Claims, 1 Drawing Sheet

METHOD OF PRODUCING AN ORGANIC LIGHT-EMISSIVE DEVICE

The present invention relates to a method of producing an organic light-emissive device comprising an electroluminescent polymer.

Organic light-emitting devices typically comprise a layer of an electroluminescent polymer arranged between an anode and a cathode such that positive and negative charge carriers can move between the anode and cathode and the electroluminescent polymer layer.

Conventionally, the electroluminescent polymer layer is deposited by coating a substrate comprising the anode or cathode with a solution of the electroluminescent polymer or a solution of a precursor to the electroluminescent polymer layer followed by conversion of the precursor to the electroluminescent polymer. Coating of the substrate with such solutions is, for example, typically carried out using a spin-coating or blade-coating technique.

In the case that a patterned light-emissive layer is required, ink-jet printing has been used to selectively deposit a solution of the electroluminescent polymer or its precursor on selected portions of the substrate.

According to a first aspect of the present invention, there is provided a method of producing an organic light-emitting device comprising a patterned electroluminescent polymer layer arranged between two electrodes such that charge carriers can move between the first and second electrodes and the electroluminescent polymer layer, the method comprising the steps of (a) providing a substrate comprising the first electrode, (b) depositing solid particles comprising the electroluminescent polymer onto selected portions of the surface of the substrate, (c) securing to the substrate those solid particles comprising electroluminescent polymer particles deposited onto the substrate in step (b) to form the patterned electroluminescent polymer layer; and (d) forming the second electrode over the surface of the electroluminescent polymer layer opposite the first electrode.

The steps of depositing the solid particles comprising electroluminescent polymer onto selected portions of the surface of the substrate, and securing them to the substrate may be carried out by an electrostatic technique of the type used in electrostatic printing. Reference is made to "Electromagnetics" by John D. Kraus, McGraw-Hill Publishing Co. 1999 and "Electromagnetics: with Applications" by John D. Kraus, McGraw-Hill Publishing Co. 1999.

The patterned layer of electroluminescent polymer may for example consist of a two-dimensional array of pixels of one or more electroluminescent polymers.

The method preferably further comprises a step of selectively covering those portions of the substrate onto which the electroluminescent polymer was not deposited with an insulator material to form an insulating matrix around the pixels of electroluminescent polymer, wherein the insulator material is preferably also deposited as solid particles of said insulator material, which are then secured to the substrate.

The solid particles comprising the electroluminescent polymer preferably have a particle size of about 100 nm. The insulator material is preferably black.

According to a preferred embodiment of the present invention, there is provided a method of producing an organic light-emitting device comprising a patterned electroluminescent polymer layer arranged between two electrodes such that charge carriers can move between the first and second electrodes and the electroluminescent polymer layer, the method comprising the steps of (a) providing a substrate comprising the first electrode, (b) providing solid particles comprising the electroluminescent polymer and capable of supporting an electrostatic charge of a first polarity; (c) providing a transfer surface having portions which are independently capable of supporting an electrostatic charge and applying an electrostatic charge of a second polarity to selected portions of the transfer surface; (d) selectively transferring said solid particles comprising electroluminescent polymer to said charged selected portions of said transfer surface by virtue of an electrostatic interaction between said selected portions of the transfer surface and the solid particles; and (e) contacting the transfer surface with the substrate so as to transfer the solid particles held thereon to selected portions of the substrate and securing them to the substrate to thereby form a patterned electroluminescent polymer layer on the substrate; and (f) forming the second electrode over the surface of the patterned electroluminescent polymer layer opposite the first electrode.

The electrodes are preferably adapted such that selected portions of the patterned electroluminescent polymer layer can be independently activated.

In one embodiment, the second electrode is formed by applying a pre-patterned second electrode to the surface of the patterned electroluminescent polymer layer.

An embodiment of the present invention shall now be described, by way of example only, with reference to the accompanying drawings, in which.

Figure 1:
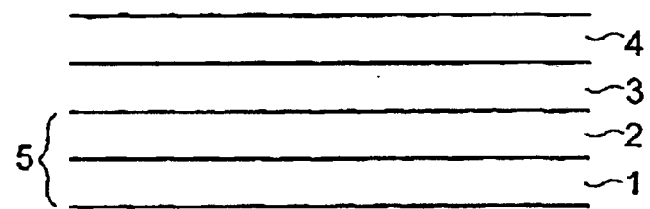
FIG. 1 shows a schematic cross-sectional view of a light-emitting device produced according to a method of the present invention.
Figure 2:
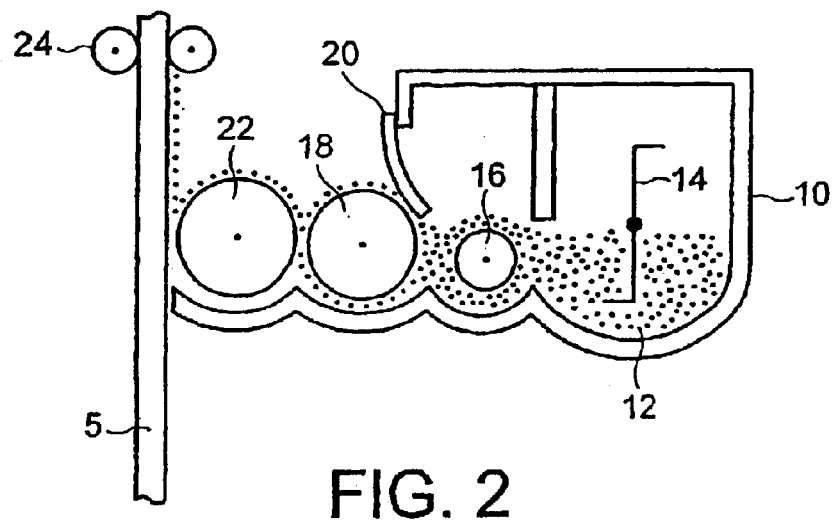
FIG. 2 shows schematically the formation of a light-emissive layer according to a method of the present invention.

With reference to FIGS. 1 and 2, a glass base 1 is pre-coated with a layer of indium tin oxide 2 to provide an anode substrate 5. The apparatus shown in FIG. 2 is used to deposit a light-emissive layer 3 on the surface of the anode substrate 5 in a batch process. According to one variation, a flexible substrate base is used instead of the rigid glass base, which allows the method described below to be carried out as part of a continuous roll-to roll manufacturing process. The ITO anode layer may be patterned depending on how the final device is to be operated. For example, an anode patterned as a plurality of rows may be used in conjunction with a cathode patterned as a plurality of columns to provide the possibility for independently addressing selected portions of the light-emissive layer.

In FIG. 2, hopper 10 contains a supply of solid particles 12 made from an electroluminescent polymer. The electroluminescent polymer may, for example, be a polyphenylene vinylene or a polyfluorene, or one of the other known electroluminescent polymers mentioned in the review of electroluminescent polymers in Adv. Mater. 2000, 12, no. 23, 1737–1750.

The solid particles are fed from the hopper by means of stirrer 14 and supply roller 16 towards a charging roller 18, which is provided with an insulating surface coating that does not dissipate electrostatic charge. A thin layer of charged solid particles is formed on the charging roller by means of the blade 20, which is made from stainless steel, and the insulating surface of the charging roller 18. The surface of developing roller 22 is adapted such that an electrostatic charge of a polarity reverse to that of the electrostatic charge of the solid particles on the charging roller can be applied to selected portions thereof by means of a laser (not shown) to create an electrostatic image on the surface of the developing roller 22. With rotation of the developing roller 18 and the charging roller 18, solid particles of the electroluminescent polymer are transferred from the charging roller to those portions of the surface of the developing roller to which an electrostatic charge or reverse polarity has been applied by virtue of an electrostatic interaction between the charge on the solid particles and on the selected portions of the surface of the developing roller. An image of solid polymer particles is thus developed on the surface of the developing roller 22.

The solid particles of electroluminescent polymer that have been transferred to the developing roller 22 are then transferred on to the surface of the anode substrate 5 and fused to the surface of the anode substrate 5 by means of fusing rollers 24. In this way, a patterned layer of electroluminescent polymer can be provided on the surface of the anode substrate 5. Alternatively, a solvent vapour, spray or saturated solvent atmosphere may be used to homogenise the polymer particles into a polymer film (vapour fusion) instead of using fusing rollers.

The solid particles of electroluminescent polymer preferably have a particle size of about 100 nm. A supply of such particles can be produced, for example, according to the following methods.

A solution of the electroluminescent polymer in a suitable solvent is sprayed using an airbrush into a swirling beaker of a liquid in which the electroluminescent polymer is not soluble. This results in the precipitation of particles of the electroluminescent polymer, which can be isolated by filtration followed by drying. The size of the particles is determined by the nozzle size of the airbrush, the pressure at which the solution of the electroluminescent polymer is sprayed through the nozzle of the airbrush and the concentration of the solution of the electroluminescent polymer. In the case of polyfluorenes, toluene is one example of a suitable solvent; others are described in, for example, WO00/59267. Examples of suitable solvents for soluble polyphenylene vinylenes include dichloromethane and chloroform.

Alternatively, the solid particles of electroluminescent polymer can be prepared according to a micella technique by forming an emulsion in water in an ultrasonic bath. Formation of micelles is described in, for example, "Micelles, Microemulsions and Monolayers" by Dinesh O Shah (Editor), Marcel Dekker 1998.

Figure 3:
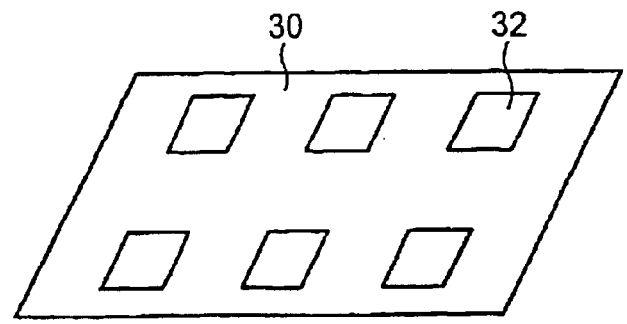
FIG. 3 shows a schematic plan view of a section of a device at an intermediate stage in its production by a method according to an embodiment of the present invention.

In some light-emitting devices, a 2D array of pixels of electroluminescent polymer is required. In such a case, it is preferable that each pixel 32 be electrically insulated from surrounding pixels 32 by providing a 2D matrix of insulator material 30 around the pixels, as shown in FIG. 3. This matrix of insulator material can be provided after forming the pixels using the same method used to form the pixels as described above except that solid particles of the insulator material are used instead of the solid particles of electroluminescent polymer. The insulator material may, for example, be a powder comprising a plastic and a pigment as commonly used as a laser printer toner.

The insulator material is preferably black in order to improve the contrast of the device.

In some cases, it is desired to form pixels of different electroluminescent polymers in order to produce a device that can be used to emit light of more than one colour. Such an array of pixels of different electroluminescent polymers can be produced by the serial deposition of solid particles of each electroluminescent polymer according to the electrostatic technique described above.

For example, the anode substrate could be passed successively through a blue station, a red station, a green station and an insulating station for respectively forming on the surface of the anode substrate pixels of polymers which are capable of emitting blue, red and green light, respectively, and then forming a matrix of insulating material around the electroluminescent polymer pixels.

A suitably patterned cathode 4 may be deposited on the layer or pixels of electroluminescent polymer by any conventional technique such as vacuum evaporation. In some instances, the fusing process may result in an uneven layer or uneven pixels of electroluminescent polymer. In such an instance, it is preferable to apply a pre-patterned cathode to the side of the electroluminescent polymer layer or pixels opposite the anode substrate. Such a pre-patterned cathode also serves to effectively encapsulate the electroluminescent polymer layer or pixels. According to one variation, the cathode strips or sheet may be put in place before the fusing process.

The light-emitting device may also have additional layers such as a hole transport polymer layer between the anode and the electroluminescent polymer layer and/or an electron transport polymer layer between the cathode and the electroluminescent polymer layer. Such layers may also be formed by the deposition of solid particles containing the respective polymer according to the technique described above.

The anode substrate 5 is preferably flexible so that it can, be curved during the process of applying the patterned electroluminescent layer thereto.

What is claimed is:

1. A method of producing an organic light-emitting device comprising a patterned electroluminescent polymer layer arranged between two electrodes such that charge carriers can move between the first and second electrodes and the electroluminescent polymer layer, the method comprising the steps of (a) providing a substrate comprising the first electrode, (b) depositing solid particles comprising the electroluminescent polymer onto selected portions of the surface of the substrate by transfer process from a transfer surface, and (c) securing to the substrate those solid particles comprising electroluminescent polymer particles deposited onto the substrate in step (b) to form the patterned electroluminescent polymer layer; and (d) forming the second electrode over the surface of the electroluminescent polymer layer opposite the first electrode to produce organic light-emitting device.

2. A method according to claim 1 further comprising the step of selectively covering those portions of the substrate onto which the electroluminescent polymer was not formed with an insulator material.

3. A method according to claim 2 comprising depositing solid particles of said insulator material to said substrate and securing the solid particles of insulator material to the substrate.

4. A method according to claim 3 wherein the electroluminescent polymer particles have a particle size of about 100 nm.

5. A method according to claim 2 wherein the insulator material is black.

6. A method of producing an organic light-emitting device comprising a patterned electroluminescent polymer layer arranged between two electrodes such that charge carriers can move between the first and second electrodes and the electroluminescent polymer layer, the method comprising the steps of (a) providing a substrate comprising the first electrode, (b) providing solid particles comprising the electroluminescent polymer and capable of supporting an electrostatic charge; (c) providing a transfer surface having portions which are independently capable of supporting an electrostatic charge and applying an electrostatic charge to selected portions of the transfer surface; (d) applying said solid particles comprising electroluminescent polymer to said charged selected portions of said transfer surface by virtue of an electrostatic interaction between said selected portions of the transfer surface and the solid particles; and (e) contacting the transfer surface with the substrate so as to transfer the solid particles held thereon to selected portions of the substrate and securing them to the substrate to thereby form a patterned electroluminescent polymer layer on the substrate; and (f) forming the second electrode over the surface of the patterned electroluminescent polymer layer opposite the first electrode.

7. A method according to claim 1 wherein the electrodes are adapted such that selected portions of the patterned electroluminescent polymer layer can be independently activated.

8. A method according to claim 2 wherein the electrodes are adapted such thtat selected portions of the patterned electroluminescent polymer layer can be independently activated.

9. A method according to claim 3 wherein the electrodes are adapted such that selected portions of the patterned electroluminescent polymer layer can be independently activated.

10. A method according to claim 6 wherein the electrodes are adapted such that selected portions of the patterned electroluminescent polymer layer can be independently activated.

11. A method according to claim 1 wherein the step of forming the second electrode includes applying a pre-patterned second electrode to the surface of the patterned electroluminescent polymer layer.

12. A method according to claim 2 wherein the step of forming the second electrode includes applying a pre-patterned second electrode to the surface of the patterned electroluminescent polymer layer.

13. A method according to claim 3 wherein the step of forming the second electrode includes applying a pre-patterned second electrode to the surface of the patterned electroluminescent polymer layer.

14. A method according to claim 6 wherein the step of forming the second electrode includes applying a pre-patterned second electrode to the surface of the patterned electroluminescent polymer layer.

15. A method according to claim 1 wherein the substrate is a flexible substrate.

16. A method according to claim 6 wherein the substrate is a flexible substrate.

\* \* \* \* \*